United States Patent
Wang et al.

(10) Patent No.: US 10,458,019 B2
(45) Date of Patent: Oct. 29, 2019

(54) FILM DEPOSITION APPARATUS HAVING A PERIPHERAL SPIRAL GAS CURTAIN

(71) Applicants: Ching-Chiun Wang, Miaoli County (TW); Chih-Yung Huang, Taichung County (TW); Kung-Liang Lin, Hsinchu (TW); Jung-Chen Chien, Jhubei (TW); Chen-Der Tsai, Hsinchu County (TW); Chien-Chih Chen, Taichung County (TW)

(72) Inventors: Ching-Chiun Wang, Miaoli County (TW); Chih-Yung Huang, Taichung County (TW); Kung-Liang Lin, Hsinchu (TW); Jung-Chen Chien, Jhubei (TW); Chen-Der Tsai, Hsinchu County (TW); Chien-Chih Chen, Taichung County (TW)

(73) Assignee: INDUSTRIAL TECHNOLOGY RESEARCH INSTITUTE, Hsin-chu (TW)

( * ) Notice: Subject to any disclaimer, the term of this patent is extended or adjusted under 35 U.S.C. 154(b) by 831 days.

(21) Appl. No.: 13/935,935

(22) Filed: Jul. 5, 2013

(65) Prior Publication Data
US 2014/0123900 A1 May 8, 2014

(30) Foreign Application Priority Data
Nov. 2, 2012 (TW) .............................. 101140760 A

(51) Int. Cl.
*C23C 16/00* (2006.01)
*C23C 16/455* (2006.01)

(52) U.S. Cl.
CPC .. *C23C 16/45565* (2013.01); *C23C 16/45519* (2013.01); *C23C 16/45572* (2013.01); *C23C 16/45593* (2013.01)

(58) Field of Classification Search
CPC ........ C23C 16/45519; C23C 16/45572; C23C 16/45593; C23C 16/45587; C23C 16/4408
See application file for complete search history.

(56) References Cited

U.S. PATENT DOCUMENTS

| 4,987,856 A | 1/1991 | Aggarwal et al. |
| 5,000,113 A | 3/1991 | Adamik et al. |

(Continued)

FOREIGN PATENT DOCUMENTS

| CN | 2440279 | 7/2001 |
| CN | 1847450 | 10/2006 |

(Continued)

OTHER PUBLICATIONS

Taiwan Patent Office, Notice of Allowance dated Mar. 3, 2015.
(Continued)

*Primary Examiner* — Charlee J C Bennett
(74) *Attorney, Agent, or Firm* — Rabin & Berdo, P.C.

(57) ABSTRACT

A gas shower device having gas curtain comprises a first gas shower unit for injecting a reaction gas, thereby forming a reaction gas region, and a second gas shower unit. The second gas shower unit arranged around a periphery of the first gas shower unit comprises a buffer gas chamber for providing a buffer gas, and a curtain distribution plate. The curtain distribution plate further comprises a plurality of through holes for injecting the buffer gas, thereby forming a gas curtain around a periphery of the reaction gas region. In another embodiment, an apparatus for depositing film is provided by utilizing the gas shower device having gas curtain, wherein the gas curtain prevents the reaction gas in the reaction gas region from being affected directly by a (Continued)

vacuum pressure so that a residence time of reaction gas can be extended thereby increasing the utilization of reaction gas and film-forming efficiency.

5 Claims, 7 Drawing Sheets

(56) References Cited

U.S. PATENT DOCUMENTS

| | | | |
|---|---|---|---|
| 5,133,284 A | 7/1992 | Broadbent et al. | |
| 5,134,965 A * | 8/1992 | Tokuda | C23C 16/45502 118/715 |
| 5,558,717 A | 9/1996 | Tom Cho et al. | |
| 5,846,332 A * | 12/1998 | Zhao | C23C 16/4411 118/728 |
| 5,882,411 A | 3/1999 | Schreiber et al. | |
| 6,059,885 A * | 5/2000 | Ohashi | C23C 16/45565 118/715 |
| 6,148,761 A | 11/2000 | Kao et al. | |
| 7,138,336 B2 | 11/2006 | Lee | |
| 7,387,685 B2 | 6/2008 | Carpenter | |
| 7,422,635 B2 | 9/2008 | Basceri | |
| 7,566,368 B2 | 7/2009 | Mitsuhashi et al. | |
| 7,641,939 B2 | 1/2010 | Bridgelux | |
| 7,737,035 B1 | 6/2010 | Johanson et al. | |
| 7,780,788 B2 | 8/2010 | Chen et al. | |
| 2005/0003600 A1* | 1/2005 | Kasai | C23C 16/14 438/200 |
| 2005/0133161 A1* | 6/2005 | Carpenter | C23C 16/45544 156/345.34 |
| 2005/0142895 A1 | 6/2005 | Bang et al. | |
| 2005/0268856 A1 | 12/2005 | Miller et al. | |
| 2009/0095221 A1 | 2/2009 | Tam | |
| 2009/0061083 A1 | 3/2009 | Chiang | |
| 2009/0061646 A1 | 3/2009 | Chiang | |
| 2009/0241833 A1* | 10/2009 | Moshtagh | C23C 16/45504 118/715 |
| 2010/0263588 A1* | 10/2010 | Zhiyin | C23C 16/45508 117/98 |
| 2010/0279008 A1* | 11/2010 | Takagi | C23C 16/409 427/248.1 |
| 2011/0027480 A1* | 2/2011 | Han | C23C 16/45565 118/715 |
| 2012/0145078 A1* | 6/2012 | Huang | C23C 16/4412 118/715 |
| 2013/0052369 A1* | 2/2013 | Salabas | H01J 37/32449 427/569 |
| 2013/0220222 A1* | 8/2013 | Huang | C23C 16/45565 118/713 |

FOREIGN PATENT DOCUMENTS

| | | | |
|---|---|---|---|
| CN | 101319308 | 12/2008 | |
| CN | 101476112 | 7/2009 | |
| CN | 101743341 | 6/2010 | |
| CN | 101872769 | 10/2010 | |
| CN | 201599113 | 10/2010 | |
| CN | 101891184 | 11/2010 | |
| CN | 201735388 | 2/2011 | |
| CN | 102080218 A | 6/2011 | |
| CN | 102230167 | 11/2011 | |
| CN | 102383106 A | 3/2012 | |
| CN | 102421938 | 4/2012 | |
| CN | 202185359 | 4/2012 | |
| CN | 102473612 | 5/2012 | |
| CN | 202226668 | 5/2012 | |
| JP | 2012169409 A * | 9/2012 | |
| JP | 2017112371 A * | 6/2017 | ....... C23C 16/45574 |
| KR | 20010104572 A | 11/2001 | |
| KR | 10-0505367 B1 | 8/2005 | |
| KR | 1020070098104 | 10/2007 | |
| KR | 20110011270 A | 2/2011 | |
| TW | 588401 | 5/2004 | |
| TW | 200905010 A | 2/2009 | |
| TW | 200927296 | 7/2009 | |
| TW | 201112333 | 4/2011 | |
| TW | 201120980 | 6/2011 | |
| TW | 201144785 | 12/2011 | |
| TW | 201213570 | 4/2012 | |
| TW | 430479 | 6/2012 | |

OTHER PUBLICATIONS

Korean Patent Office, Office Action dated Jul. 28, 2014.
Zuo et al., "Transport phenomena in radial flow MOCVD reactor with three concentric vertical inlets", Journal of Crystal Growth, vol. 293, pp. 498-508, 2006.
Mitrovic et al., "Reactor design optimization based on 3D modeling of nitrides deposition in MOCVD vertical rotating disc reactors", Journal of Crystal Growth, vol. 289 pp. 708-714, 2006.
Mitrovic et al., "Process conditions optimization for the maximum deposition rate and uniformity in vertical rotating disc MOCVD reactors based on CFD modeling", Journal of Crystal Growth, vol. 303 pp. 323-329, 2007.
Mitrovic et al., "On the flow stability in vertical rotating disc MOCVD reactors under a wide range of process parameters", Journal of Crystal Growth, vol. 287, pp. 656-663, Apr. 21, 2006.
Dauelsberg et al., "Modeling and experimental verification of deposition behavior during AlGaAs growth: a comparison for the carrier gases N2 and H2", Journal of Crystal Growth, vol. 223, pp. 21-28, 2001.
Kadinski et al., "Computational analysis of GaN/InGaN deposition in MOCVD vertical rotating disk reactors", Journal of Crystal Growth, vol. 261, pp. 175-181, Aug. 2, 2004.
China Patent Office, Office Action, Patent Application Serial No. 201210534969.8, dated Jul. 1, 2015, China.

* cited by examiner

FILM DEPOSITION APPARATUS HAVING A PERIPHERAL SPIRAL GAS CURTAIN

CROSS REFERENCE TO RELATED APPLICATION

This application also claims priority to Taiwan Patent Application No. 101140760 filed in the Taiwan Patent Office on Nov. 2, 2012, the entire content of which is incorporated herein by reference.

TECHNICAL FIELD

The present disclosure relates to a gas spraying technique, and more particularly, to a gas shower device with gas curtain and a film deposition apparatus using the same.

BACKGROUND

In any current device for enabling a metal organic chemical vapor deposition (MOCVD) process, the showerhead design can be the major factor affecting the flow field uniformity and deposition rate in the MOCVD process. In recent years, showerheads are arranged at position at the top of a process chamber and covering an area corresponding to a wafer carrier inside the process chamber. Thereby, the showerheads that are disposed above the wafer carrier are used for spraying a reaction gas to a wafer loaded on the wafer carrier.

In a MOCVD process for manufacturing light emitting diode (LED) epitaxial wafers, the flow field uniformity and residence time of the reaction gases that are being projected out of the showerheads are the key factors affecting the LED binning and production cost. That is, when the reaction gases inside the process chamber are distributed uniformly for a long period of residence time, not only the gas utilization ratio is improved, but also the MOCVD deposition rate is enhanced, and as a consequence, the power consumption and production cost are reduced.

For a film deposition process, the use of conventional showerheads for spraying reaction gases can generally cause a flow stagnation zone to happen in the center area of a process chamber due to overly concentrated distribution of reaction gases, and also the wavelength uniformity at wafer edge can be adversely affected. Consequently, a conventionally means for controlling the spraying of reaction gases into a process chamber while pumping the reaction gases to be exhausted out of the process chamber through a side of the process chamber is used for improving the flow field uniformity in the process chamber.

Nevertheless, although the flow field uniformity can be improved by the drawing of vacuum pump, the reaction gases are going to be drawn away from the wafer faster than it is intended in an ideal condition after the reaction gases is sprayed on the wafer. Thus, the residence time of the reaction gases inside the process chamber is shortened, and as a consequence, the utilization rate of the reaction gases is reduced and eventually the deposition rate is adversely affected. In addition, since the closer to the vacuum pump the reaction gases inside the process chamber will get more sparsely distributed, the wavelength uniformity at wafer edge can also be adversely affected.

SUMMARY

The present disclosure relates to a gas shower device with gas curtain and a film deposition apparatus using the same, according to which there is a gas curtain being provided surrounding the showerheads of the gas shower device so as to be used for confining the spray of a reaction gas in a specific area for controlling the reaction gas inside a process chamber to reach a specific concentration and also increasing the residence time of the reaction gas inside a reaction zone of the process chamber Thereby, the utilization rate of the reaction gas is improved, the deposition rate is enhanced and thus the production cost can be reduced.

In an exemplary embodiment, the present disclosure provides a gas shower device having gas curtain, which comprises a first gas shower unit for injecting a reaction gas, thereby forming a reaction gas region; and a second gas shower unit, arranged around a periphery of the first gas shower unit, further comprising: a buffer gas chamber for providing a buffer gas, and a being connected to the buffer gas chamber circumferentially furnished at the periphery of the first shower unit, and having a plurality of through-holes provided for letting the buffer gas to pass therethrough to generate a gas curtain surrounding the periphery of the process gas region.

In another exemplary embodiment, the present disclosure provides a film deposition apparatus, which comprises: a process chamber, a first shower unit, a vacuum pump and a second shower unit; wherein, the first and the second shower units are arranged on top of the process chamber for injecting a reaction gas into the process chamber and thus forming a reaction gas region; the vacuum pump is arranged coupling to the process chamber for causing a vacuum negative pressure to build inside the process chamber; the second shower unit that is located on top of the process chamber is further being arranged surrounding the first shower unit and is further comprised of: a buffer gas chamber for providing a buffer gas, and a gas curtain distribution plate, being connected to the buffer gas chamber circumferentially furnished at the periphery of the first shower unit, and having a plurality of through-holes provided for letting the buffer gas to pass therethrough to generate a gas curtain surrounding the periphery of the process gas region.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
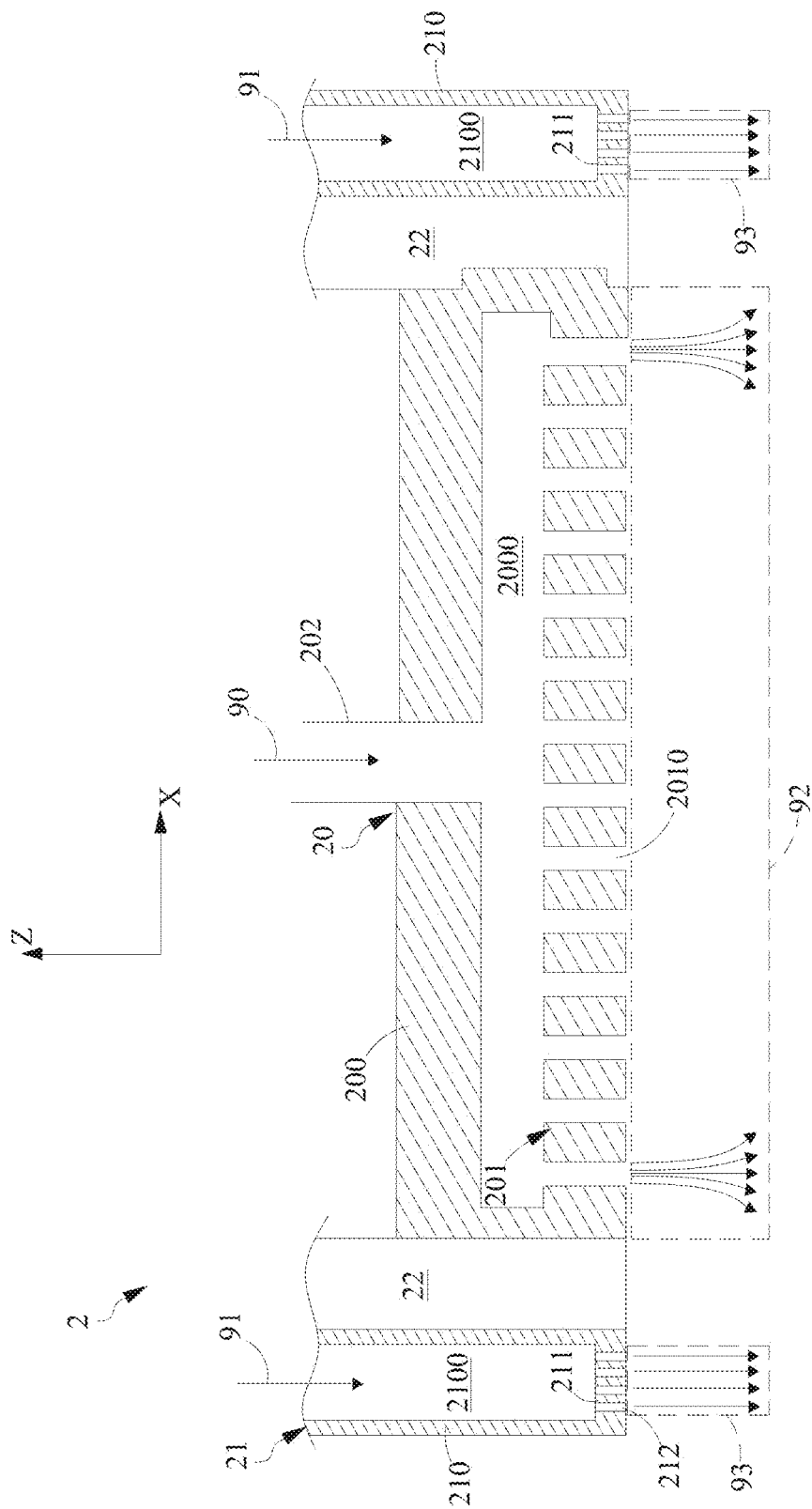
FIG. 1 is a sectional view of a gas shower device with gas curtain according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a sectional view of a gas shower device with gas curtain according to an embodiment of the present disclosure. As shown in FIG. 1, the gas shower device 2 in this embodiment is comprised of: a first shower unit 20 and a second shower unit 21, in which the first shower unit 20 is provided for injecting a reaction gas 90 and thus forming a reaction gas region 92. In this embodiment, the first shower unit is configured with a reaction gas supply chamber 200 and a gas distribution plate 201. Moreover, the reaction gas supply chamber 200 is formed with an accommodation space 2000 therein for receiving the reaction gas 90 that is being fed into the accommodation space 200 via at least one channel 202; and the gas distribution plate 201 is further configured with a plurality of gas holes 2010 for injecting the reaction gas 90 onto a substrate. In this embodiment, the first shower unit 20 is formed in a circular shape, and correspondingly, both the gas distribution plate 201 and the reaction gas supply chamber 200 are circular structures. It is noted that although the first shower unit is formed in a circular shape, but it is not limited thereby. In addition, the first shower unit 20 in the embodiment of FIG. 1 is designed to provide only one kind of reaction gas, but it is also not limited thereby, and thus the first shower unit 20 can be designed to provide a plurality of reaction gases at the same time.

The second shower unit 21 is arranged surrounding the periphery of the first shower unit 20. In this embodiment, the first shower unit 20 is formed in a circular shape, and as a consequence, the second shower unit 21 should be formed as a ring that is connected to the circular first shower unit 20. In addition, there is a cooling unit 22 to be arranged at a position between the first shower unit 20 and the second shower unit 21 that is used for cooling the first shower unit 20. It is noted that the cooling unit 22 can be disposed at any position at will in the gas shower device of the present disclosure, and thus is not limited by the present embodiment.

Moreover, the second shower unit 21 is further configured with a buffer gas chamber 210 and a curtain distribution plate 211. The buffer gas chamber 210 that is arranged surrounding the first shower unit 20 is formed with an accommodation space 2100 for receiving a buffer gas 91. The curtain distribution plate 211 is connected to the bottom of the buffer gas chamber 210 and is also arranged surrounding the first shower unit 20. In FIG. 1, the curtain distribution plate 211 is configured with a plurality of through holes 212 that are provided for the buffer gas 92 to be injected therethrough, and thereby forming a gas curtain 93 surrounding a periphery of the reaction gas region 92. The buffer gas can be the same gas as the reaction gas 90, or can be some other kind of gas that is different from and is not react with the reaction gas, or can simply be an inert gas, such as nitrogen or helium, but is not limited thereby.

Figure 2A:
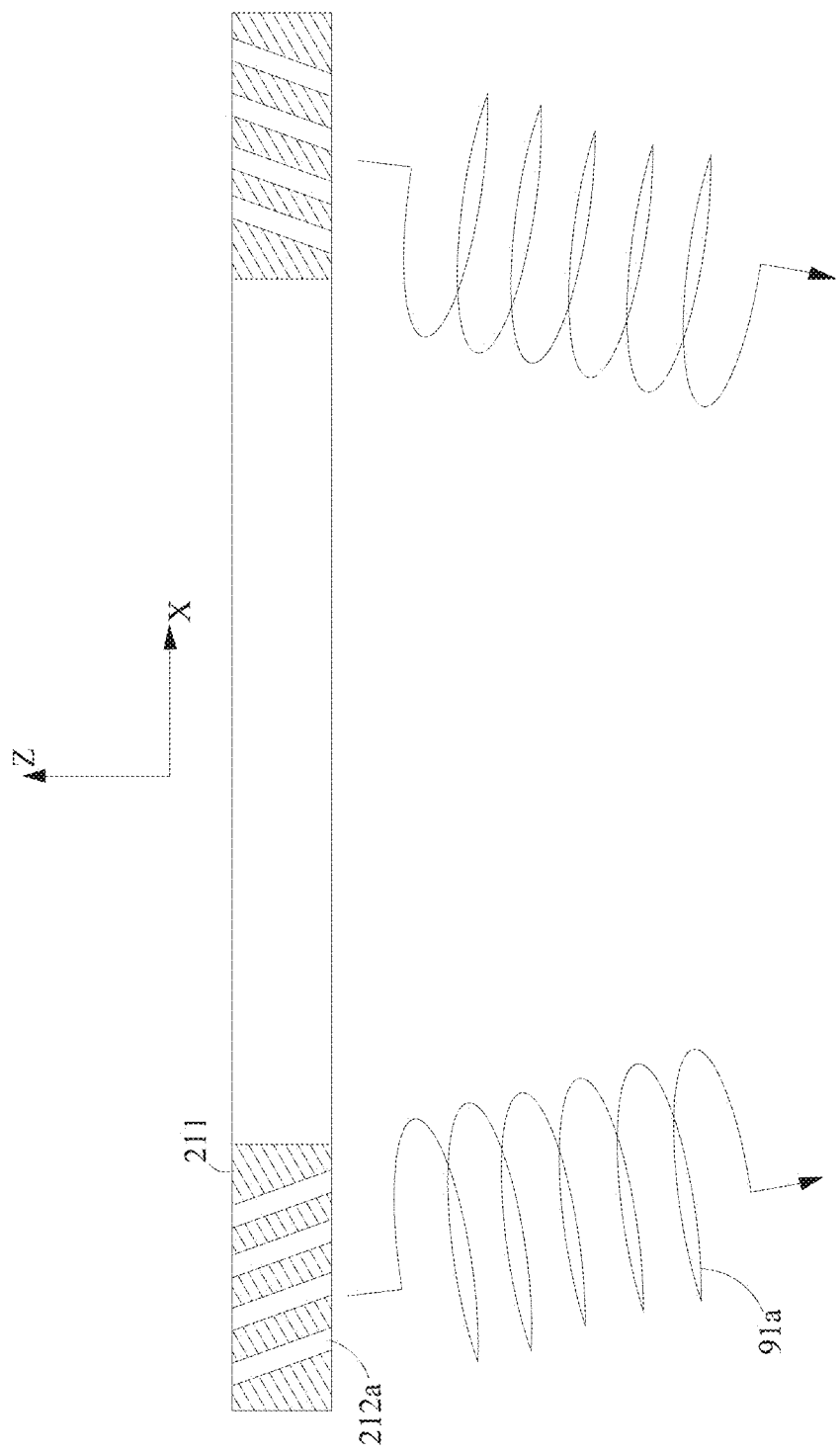
FIG. 2A is a sectional view of a distribution plate in a second shower unit according to an embodiment of the present disclosure.
Figure 2B:
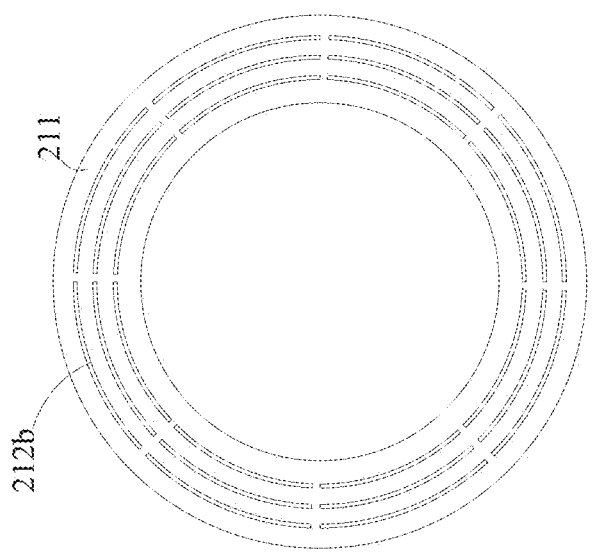
FIG. 2B is a top view of a distribution plate in a second shower unit according to an embodiment of the present disclosure.

In the embodiment shown in FIG. 1, each of the plural through holes 212 is a vertical via hole that is arranged parallel in a Z-axis direction. However, in another embodiment shown in FIG. 2A, each of the plural through holes 212a can be a oblique via hole that is arranged formed an included angle with the Z-axis direction. Consequently, by the oblique through holes 212a, the gas curtain induced from the injection of the curtain distribution plate 211 is a spiral gas curtain, as shown in FIG. 2A. In the embodiments shown in FIG. 1 and FIG. 2A, the cross section of each of the through holes can be a circular or a polygon. Please refer to FIG. 2B, which is a top view of a distribution plate in a second shower unit according to an embodiment of the present disclosure. In the embodiment shown in FIG. 2B, the cross section of each of the trough holes 212B is formed in a shape like a slit, and also can be used for generating a gas curtain. Similarly, each of the slit-like through holes 212b can also be a vertical via hole, as those shown in FIG. 1, or can be an oblique via hole, as those shown in FIG. 2A.

Figure 3:
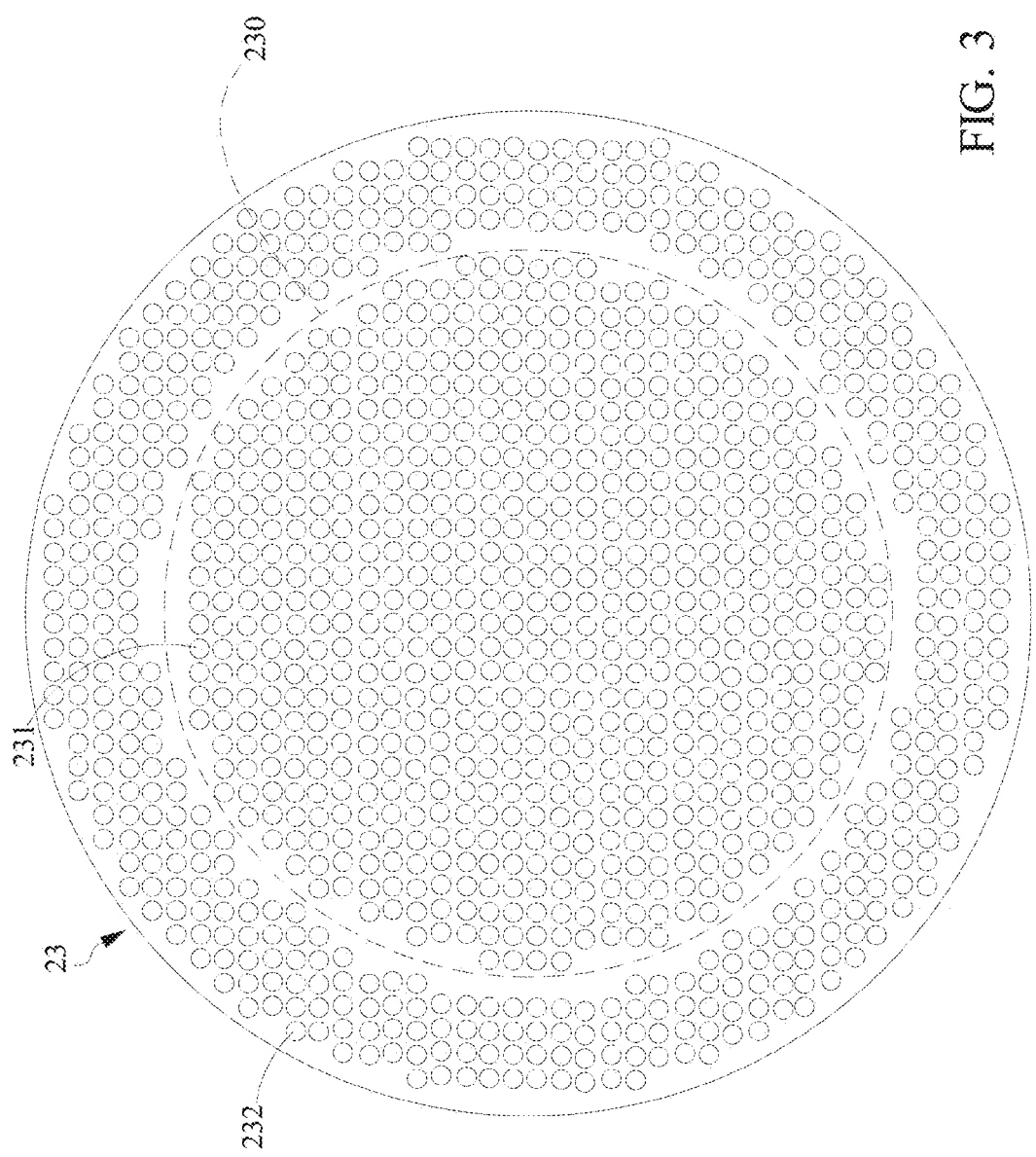
FIG. 3 is a top view of a panel being formed as the integration of the distribution plates of the first and the second shower units according to an embodiment of the present disclosure.

Please refer to FIG. 3, which is a top view of a panel being formed as the integration of the distribution plates of the first and the second shower units according to an embodiment of the present disclosure. In this embodiment, the gas distribution plate 201 of the first shower unit 20 is integrally formed with the curtain distribution plate 211 of the second shower unit 21, by that the gas holes 2010 and the through holes 212 are formed on a same plate 23 in a manner that the via holes 231 that are located within an area defined by the dotted line 230 are arranged at positions corresponding to the first shower unit 20 for allowing the reaction gas to flow therethrough, and the via holes 232 located outside the area defined by the dotted line 230 are arranged at positions corresponding to the second shower unit 21 for allowing the buffer gas to flow therethrough. Thus, by the integrated plate 23 of FIG. 3, the buffer gas is able to flow through the via holes 232 and form a gas curtain enclosing the reaction gas region formed from the injection of the reaction gas through the via holes 231.

Figure 4:
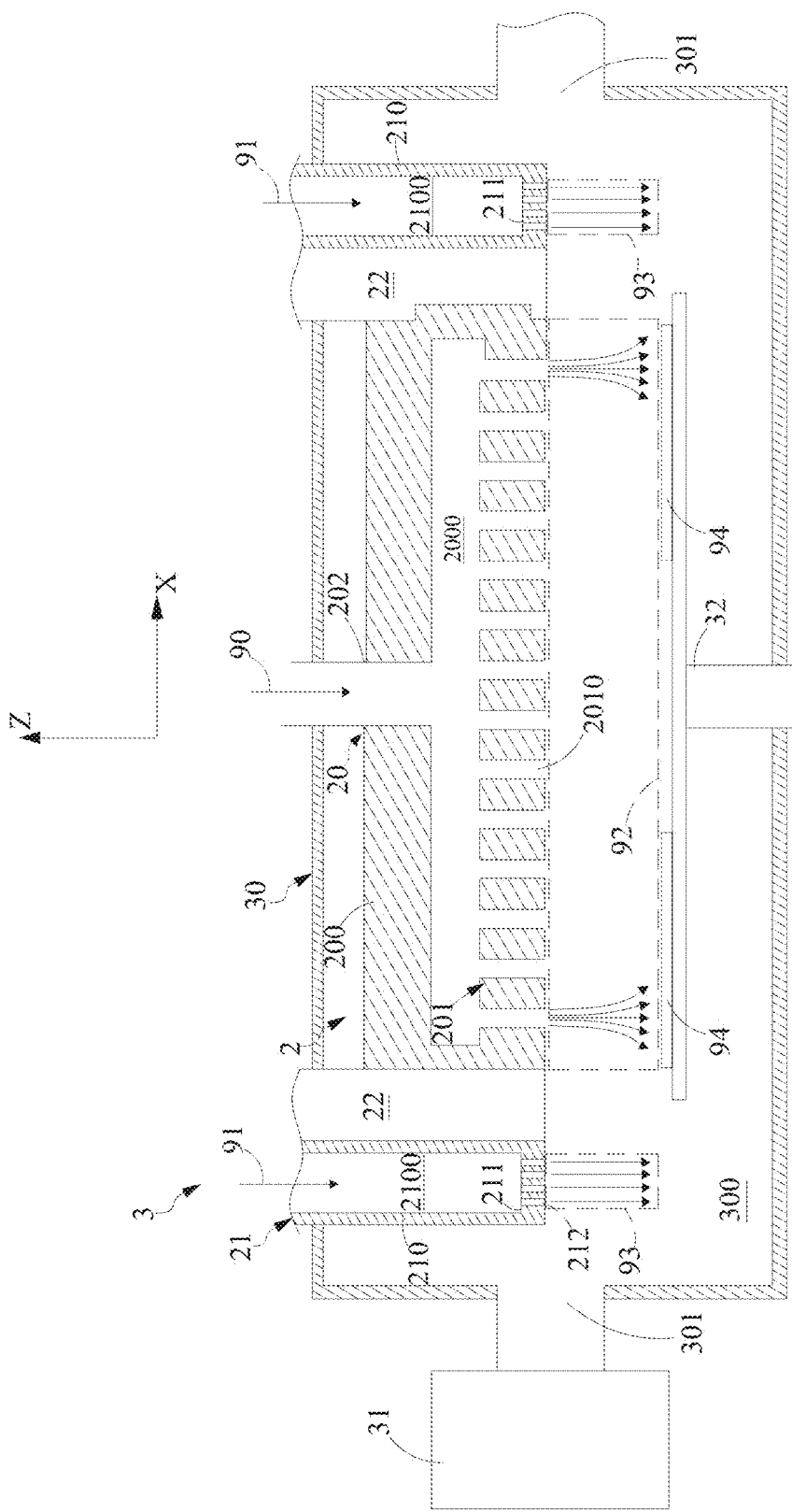
FIG. 4 is a sectional view of a film deposition apparatus according to an embodiment of the present disclosure.

Please refer to FIG. 4, which is a sectional view of a film deposition apparatus according to an embodiment of the present disclosure. In the embodiment shown in FIG. 4, the film deposition apparatus 3 is a MOCVD device, but it is not limited thereby and thus can be a plasma enhanced chemical vapor deposition (PECVD) device, an atmosphere pressure chemical vapor deposition (APCVD) device, or a low pressure chemical vapor deposition (LPCVD) device for instance. As shown in FIG. 4, the film deposition apparatus 3 comprises: a process chamber 30, a vacuum pump 31 and a gas shower device 2, in which the process chamber 30 is formed with a processing space 300 where is provided for a platform 32 to be arranged therein while allowing the platform 32 to move up and down in a Z-axis direction. Accordingly, a substrate 94 that is to be processed is carried on the platform 32, and in an embodiment, the substrate 94 can be an LED substrate. The vacuum pump 31 is arranged connecting to the openings 301 formed respectively on two sides of the process chamber 30 and used for causing a vacuum negative pressure to build inside the processing space 300 of the process chamber 30. Center portions of the respective side openings 301 are in line with the plurality of gas through holes 2010 provided in gas distribution plate 201 and are in line with the plurality of buffer gas through holes 212 provided in curtain distribution plate 211. The substrate platform 32 is disposed within the processing space 300 below respective side openings 301. The gas shower device 2 is substantially the gas shower device shown in FIG. 1, and thus will not be described further herein.

Operationally, a reaction gas 90 is injected into the processing space 300 of the process chamber 30 from a first showerhead unit 20 that is arranged on top of the process chamber 30, by that a reaction gas region 92 is formed inside the processing space 300. During the injection of the reaction gas 90 for forming the reaction gas region 92, the vacuum pump 31 is activated for vacuuming the processing space 300 of the process chamber 30 for causing a vacuum negative pressure to build inside the process chamber 30. Simultaneously, the second showerhead unit 21 drives a buffer gas 91 to flow from the buffer gas chamber 210 to be projected out of the curtain distribution plate 211 through the plural through holes 212 so as to form a gas curtain 93 surrounding the reaction gas region 92. As a consequence, due to the isolation enabled by the gas curtain 93, the vacuum negative pressure caused by the vacuum pump 31 will have no affection upon the flowing of the reaction gas 90 inside the reaction gas region 92, so that the residence time of the reaction gas 90 inside the process chamber 300 can be prolonged. In addition, also due to the shielding effect induced by the gas curtain 92, the reaction gas 90 injected from the first showerhead unit 20 can maintain to flow vertically downward to the substrate 94 without being affected by the vacuum negative pressure caused by the vacuum pump 31, which is beneficial to the increasing of film deposition rate since the residence time of the reaction gas 90 inside the reaction gas region 92 is improved. It is noted that the improvement over the residence time of the reaction gas 90 inside the reaction gas region 92 is also beneficial to the increasing of the utilization rate of the reaction gas 90.

Figures 5A, 5B:
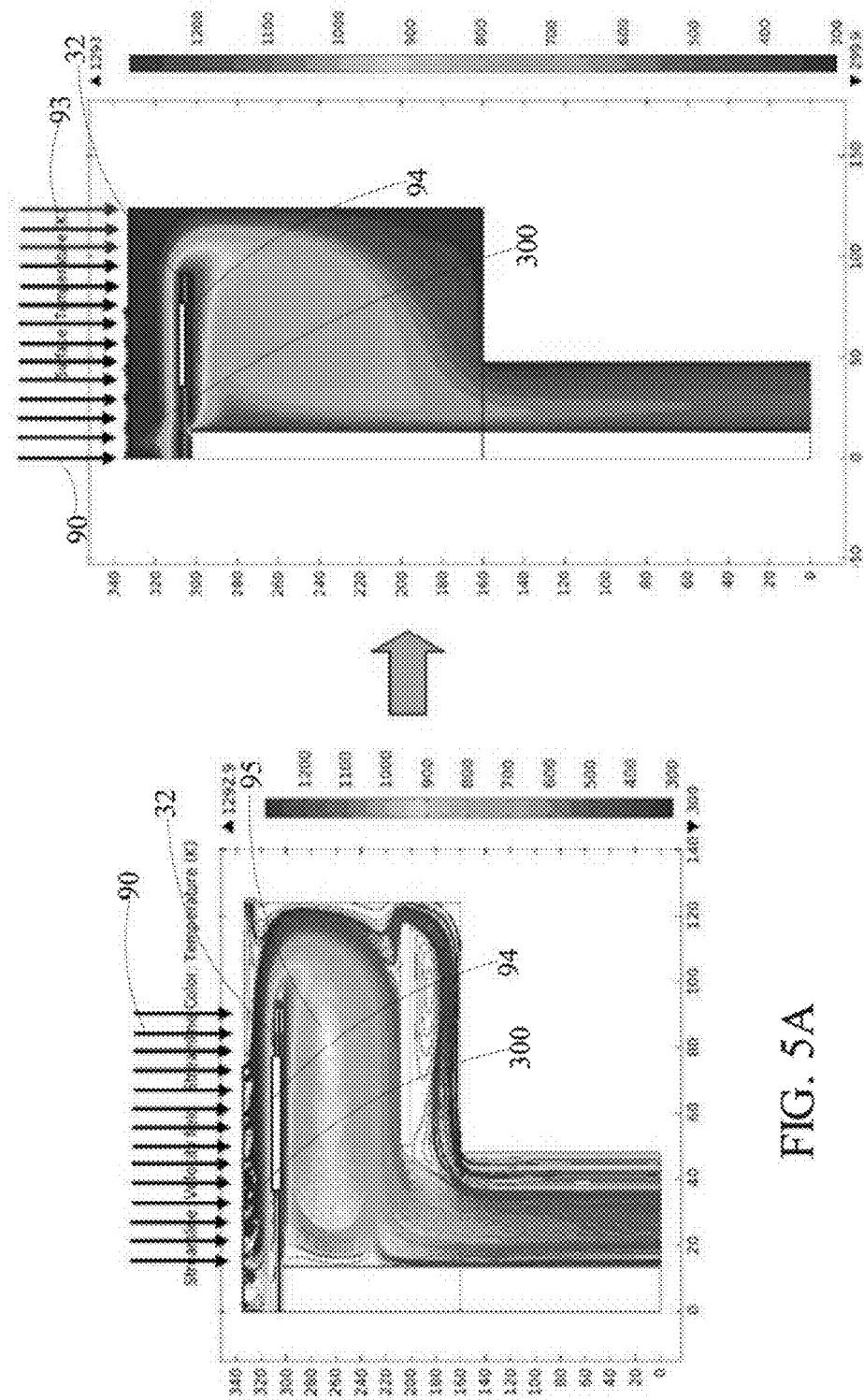
FIG. 5A and FIG. 5B are schematic diagrams showing respectively a flow field inside a process chamber when there is no gas curtain existed and when there is gas curtain existed.

Please refer to FIG. 5A and FIG. 5B, which are schematic diagrams showing respectively a flow field inside a process chamber when there is no gas curtain existed and when there is gas curtain existed. FIG. 5A shows a flow field inside a process chamber without the protection of a gas curtain, while FIG. 5B shows a flow field inside a process chamber with the protection of a gas curtain. As shown in FIG. 5A, in a condition when the flow of reaction gas 90 encounters the rotating platform 32 and is flowing without the protection of a gas curtain, there will be a great amount of reverse flow 95 being induced, which can easily be attracted by the vacuum negative pressure so as to flow out of the process chamber, and thus, the residence time of the reaction gas 90 inside the process chamber is reduced. On the other hand, as shown in FIG. 5B, by the protection of the gas curtain, the amount of reverse flow is reduced so that the residence time of the reaction gas 90 is increased and thus both the gas utilization rate and the deposition rate can be improved.

Figure 6:
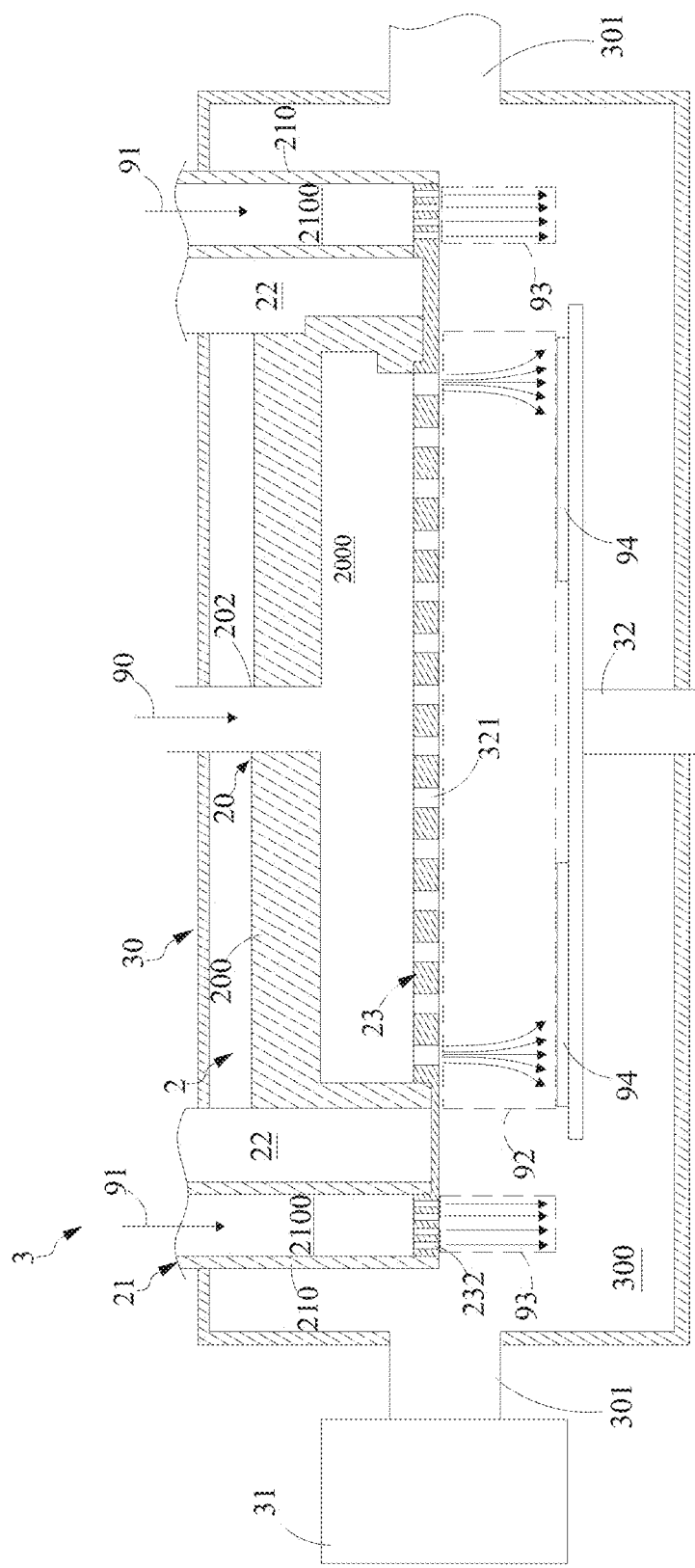
FIG. 6 is a sectional view of a film deposition apparatus according to another embodiment of the present disclosure.

Please refer to FIG. 6, which is a sectional view of a film deposition apparatus according to another embodiment of the present disclosure. The film deposition apparatus of FIG. 6 is constructed basically the same as the one shown in FIG. 4, but is different in that: in this embodiment of FIG. 6, the gas distribution plate of the first shower unit 20 is integrally formed with the curtain distribution plate of the second shower unit 21, by that the g gas distribution plate and the curtain distribution plate are formed on a same plate 23 in a manner that the via holes 231 are arranged at positions corresponding to the first shower unit 20 for allowing the reaction gas 90 to flow therethrough so as to form a reaction gas region 92, and the via holes 232 are arranged at positions corresponding to the second shower unit 21 for allowing the buffer gas to flow therethrough so as to formed a gas curtain 93 surrounding the periphery of the reaction gas region 92.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A film deposition apparatus having a peripheral gas curtain that prolongs reaction gas residence time, comprising:
a process chamber defining a processing space and having two sides in which are defined respective side openings;
a first gas showerhead unit arranged proximate to a top portion of the process chamber, having a reaction gas supply chamber that receives reaction gas provided through a top portion of the first gas showerhead unit, and having a gas distribution plate, in which are defined a plurality of gas through holes provided in a bottom portion of the first gas showerhead unit in line with center portions of the respective side openings of the process chamber through which the reaction gas is injected from the reaction gas supply chamber into the processing space of the process chamber as a vertically downward flow to form a reaction gas region;
a substrate platform disposed within the processing space below the respective side openings of the process chamber, configured to be movable up and down, and arranged to receive a substrate on which a film is to be deposited and to expose the substrate to the reaction gas within the reaction gas region;
a vacuum pump connected to said respective side openings of the process chamber to cause a vacuum negative pressure to build inside the processing space of the process chamber;
a second gas showerhead unit arranged proximate to the top portion of the process chamber, circumferentially surrounding a periphery of the first gas showerhead unit, having a buffer gas chamber that receives buffer gas provided in a top portion of the buffer gas chamber, and having a gas curtain distribution plate, in which is defined a plurality of buffer gas through holes, provided in a bottom portion of the buffer gas chamber in line with center portions of the respective side openings of the process chamber through which the buffer gas is injected into the processing space of the process chamber as said peripheral gas curtain which surrounds the periphery of the reaction gas region in a manner effective to maintain the vertically downward flow of the reaction gas and reduce removal of the reaction gas due to the vacuum negative pressure caused by the vacuum pump so as to prolong reaction gas residence time; and
a circulation cooling unit, disposed at a position between the first gas showerhead unit and the second gas showerhead unit and surrounding the periphery of the first gas showerhead unit;

wherein the plurality of buffer gas through holes defined in the gas curtain distribution plate is a plurality of oblique through holes, each oblique through hole of the plurality of oblique through holes being inwardly inclined toward the processing space of the process chamber, and the peripheral gas curtain being a spiral gas curtain, and wherein each oblique through hole of the plurality of oblique through holes has a cross section that is a circle or a slit.

2. The film deposition apparatus of claim 1, wherein the buffer gas is the same gas as the reaction gas.

3. The film deposition apparatus of claim 1, wherein the buffer gas is an inert gas.

4. The film deposition apparatus of claim 1, wherein the gas distribution plate is a circular plate, and the reaction gas supply chamber has a cross section that is circular.

5. The film deposition apparatus of claim 1, wherein the gas distribution plate is integrally formed with the gas curtain distribution plate.

* * * * *